United States Patent
Hara et al.

(10) Patent No.: US 9,462,091 B2
(45) Date of Patent: Oct. 4, 2016

(54) INFORMATION PROCESSING APPARATUS, COMMUNICATION METHOD AND STORAGE MEDIUM

(71) Applicant: CANON KABUSHIKI KAISHA, Tokyo (JP)

(72) Inventors: Yuji Hara, Machida (JP); Hisashi Ishikawa, Urayasu (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/931,052

(22) Filed: Nov. 3, 2015

(65) Prior Publication Data

US 2016/0057256 A1  Feb. 25, 2016

Related U.S. Application Data

(63) Continuation of application No. 13/572,961, filed on Aug. 13, 2012, now Pat. No. 9,201,839.

(30) Foreign Application Priority Data

Sep. 15, 2011  (JP) ................................. 2011-202334

(51) Int. Cl.
  *H04L 29/06* (2006.01)
  *G06F 15/173* (2006.01)
  *H04L 12/40* (2006.01)

(52) U.S. Cl.
  CPC ......... *H04L 69/22* (2013.01); *G06F 15/17375* (2013.01); *H04L 12/40* (2013.01); *H01L 2224/4103* (2013.01)

(58) Field of Classification Search
  CPC ...................................................... H04L 69/22
  See application file for complete search history.

(56) References Cited

U.S. PATENT DOCUMENTS

| 4,809,267 A | 2/1989 | Higuchi et al. |
| 6,005,869 A | 12/1999 | Sakai et al. |
| 9,154,453 B2 * | 10/2015 | Michels ................ H04L 49/901 |

(Continued)

FOREIGN PATENT DOCUMENTS

| JP | 01-023340 | 1/1989 |
| JP | 02-283142 | 11/1990 |

(Continued)

OTHER PUBLICATIONS

Japanese Office Action issued in corresponding application No. 2011202334 on Jul. 31, 2015.

*Primary Examiner* — Shaq Taha
(74) *Attorney, Agent, or Firm* — Carter, DeLuca, Farrell & Schmidt, LLP

(57) ABSTRACT

There is provided an information processing apparatus including a plurality of communication units connected to one another in a ring shape by a bus, each of the plurality of communication units being connected to one of processing units, each of which executes a predetermined process, and transmitting data processed by the one of the processing units to the bus as a packet, the information processing apparatus transferring data between the processing units and processing the data in a predetermined order. Among the plurality of communication units, in at least one communication unit, a packet including a value indicative of suspension of the process is generated when the connected processing unit has suspended a process, and information showing whether or not the generation unit has generated the packet including the value indicative of suspension of the process is stored.

15 Claims, 9 Drawing Sheets

(56) References Cited

U.S. PATENT DOCUMENTS

2005/0276274 A1* 12/2005 Mattina ................ H04L 12/427
                                                         370/403
2010/0329267 A1   12/2010 Sakamoto et al.
2011/0016242 A1    1/2011 Hara et al.
2012/0331184 A1* 12/2012 Adar ....................... G06F 13/28
                                                         710/22

FOREIGN PATENT DOCUMENTS

| JP | 05-081178    | 4/1993  |
| JP | 2006-252554 A | 9/2006  |
| JP | 2010-206517 A | 9/2010  |
| JP | 2010-282557 A | 12/2010 |
| JP | 2011-128812 A | 6/2011  |

* cited by examiner

INFORMATION PROCESSING APPARATUS, COMMUNICATION METHOD AND STORAGE MEDIUM

CROSS REFERENCE TO RELATED APPLICATIONS

This application is a continuation of U.S. patent application Ser. No. 13/572,961, filed Aug. 13, 2012, which claims the benefit of and priority to Japanese Patent Application No. 2011-202334, filed Sep. 15, 2011, the entire contents of each of which are hereby incorporated by reference herein in their entirety.

BACKGROUND OF THE INVENTION

1. Field of the Invention

The present invention relates to an information processing apparatus, communication method and storage medium that transfer and process data using a ring-shaped bus.

2. Description of the Related Art

There is a conventional method for achieving high-speed pipeline processing, whereby a sequence of data processing constituting the pipeline processing is divided into groups, the groups of data processing are assigned to a plurality of modules, and the plurality of modules are connected by a bus in the order of the flow of processing (Japanese Patent Laid-Open No. 5-081178). However, when modules are connected by a physical bus, it is difficult to change the order of pipeline processing, e.g. change processes A→B→C to processes A→C→B. Note that the above assignment is made to avoid overlapping of processes A, B and C.

In image processing, the efficiency of processing may be improved by changing the order of the sequence of processing. For example, in the case where an image is output to an output apparatus, if the number of pixels in the input image is greater than the number of pixels of the output apparatus, it would be efficient to process the image after reducing the number of pixels therein in the upstream process close to the start of processing. On the other hand, if the number of pixels in the input image is smaller than the number of pixels of the output apparatus, it is better to process the image having the small number of pixels without executing resolution conversion, and then increase the number of pixels in the image by executing resolution conversion in the downstream process immediately before the output.

In some cases, data defined in a certain space (e.g. an input device space) is processed after being converted into a standard space (e.g. a CIELAB color space), and the processed data is converted into another space (e.g. an output device space). In such cases, the space conversion units at the input side and the output side execute processing (one-dimensional LUT, matrix operation, three-dimensional LUT, etc.) in the reverse order. That is to say, if the order of processing can be changed, the input side and the output side may be able to share the same processing module. One way to enable a change in the processing order is to connect processing circuits by a ring-shaped bus (hereinafter referred to as a ring bus) (Japanese Patent Laid-Open No. 1-023340 and No. 2-283142).

However, in the case of a branch process where two processes A→B and A→C are simultaneously executed in pipeline processing composed of processes A→B→C, if a processing module at one side suspends a packet without processing the same, that processing module cannot be identified. This gives rise to the problem that the suspended packet cannot be deleted at a correct timing and is therefore stalled on the ring bus. Furthermore, should the suspended packet be deleted before data included in the suspended packet is processed by another processing module that is supposed to process that data, the subsequent packets cannot be processed. This gives rise to the problem that the ring bus ends up in a deadlock.

The present invention provides technology for executing a branch process without losing data in a data path control mechanism in which a plurality of processing units are connected by a ring-shaped bus.

SUMMARY OF THE INVENTION

According to one aspect of the present invention, there is provided an information processing apparatus including a plurality of communication units connected to one another in a ring shape by a bus, each of the plurality of communication units being connected to one of processing units, each of which executes a predetermined process, and transmitting data processed by the one of the processing units to the bus as a packet, the information processing apparatus transferring data between the processing units and processing the data in a predetermined order, wherein among the plurality of communication units, at least one communication unit comprises: a generation unit configured to, when the connected processing unit has suspended a process, generate a packet including a value indicative of suspension of the process; and a storage unit configured to store information showing whether or not the generation unit has generated the packet including the value indicative of suspension of the process.

According to one aspect of the present invention, there is provided an information processing apparatus including a plurality of communication units connected to one another in a ring shape by a bus, each of the plurality of communication units being connected to one of processing units, each of which executes a predetermined process, and transmitting data processed by the one of the processing units to the bus as a packet, the information processing apparatus transferring data between the processing units and processing the data in a predetermined order, wherein among the plurality of communication units, at least one communication unit comprises: a storage unit configured to store information for identifying the connected processing unit; and a generation unit configured to, when the connected processing unit has suspended a process, generate a packet including the information for identifying the connected processing unit.

According to one aspect of the present invention, there is provided a communication method used in an information processing apparatus including a plurality of communication units connected to one another in a ring shape by a bus, each of the plurality of communication units being connected to one of processing units, each of which executes a predetermined process, and transmitting data processed by the one of the processing units to the bus as a packet, the information processing apparatus transferring data between the processing units and processing the data in a predetermined order, wherein in at least one communication unit among the plurality of communication units, the communication method comprises: generating, by a generation unit, a packet including a value indicative of suspension of a process when the connected processing unit has suspended the process; and storing, by a storage unit, information showing whether or not the packet including the value indicative of suspension of the process has been generated in the generating step.

According to one aspect of the present invention, there is provided a communication method used in an information processing apparatus including: a plurality of communication units connected to one another in a ring shape by a bus; and a storage unit, each of the plurality of communication units being connected to one of processing units, each of which executes a predetermined process, and transmitting data processed by the one of the processing units to the bus as a packet, the information processing apparatus transferring data between the processing units and processing the data in a predetermined order, the storage unit storing therein information for identifying the processing unit connected to at least one communication unit among the plurality of communication units, wherein in the at least one communication unit, the communication method comprises: generating, by a generation unit, a packet including the information for identifying the connected processing unit when the connected processing unit has suspended a process.

Further features of the present invention will be apparent from the following description of exemplary embodiments with reference to the attached drawings.

DESCRIPTION OF THE EMBODIMENTS

An exemplary embodiment(s) of the present invention will now be described in detail with reference to the drawings. It should be noted that the relative arrangement of the components, the numerical expressions and numerical values set forth in these embodiments do not limit the scope of the present invention unless it is specifically stated otherwise.

First Embodiment (Configuration of Information Processing Apparatus)

Figure 1:
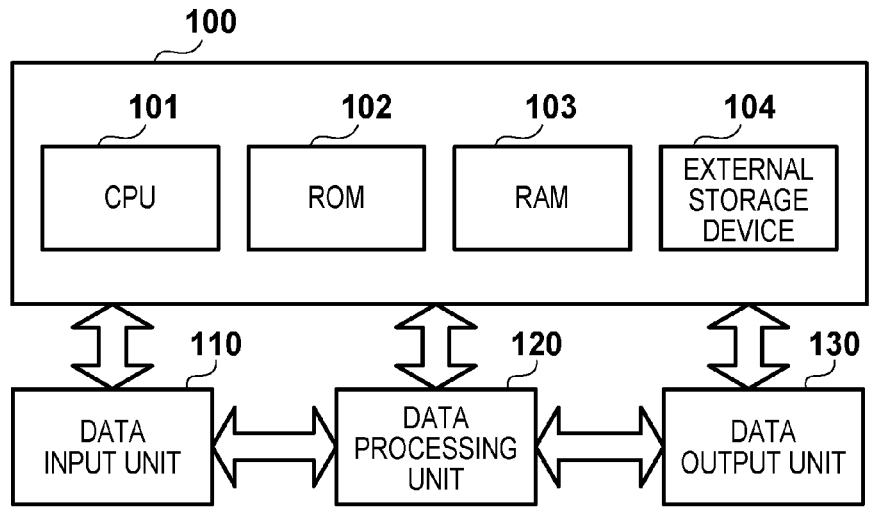
FIG. 1 shows a configuration of an information processing apparatus.

FIG. 1 shows an example of a configuration of an information processing apparatus pertaining to the present embodiment. A control unit 100 includes a CPU 101 for arithmetic control, a ROM 102 that stores therein fixed data and programs, a RAM 103 used to temporarily store data and load programs, and an external storage device 104 that holds external data.

A data input unit 110 imports data to be processed. The data input unit 110 may be, for example, an image reading apparatus constituted by devices such as an image scanner and an A/D converter, or an audio input apparatus constituted by devices such as a microphone and an A/D converter. Alternatively, the data input unit 110 may be a reception unit that acquires data from an input device. As will be described later, a data processing unit 120 executes parallel processing using a plurality of processing modules. The data processing unit 120 processes image data and the like. However, the target of processing by the data processing unit 120 is not limited to this, but may be any data appropriate for a sequence of data processing such as pipeline processing. A data output unit 130 outputs processed data to the outside. The data output unit 130 may be, for example, an image output apparatus including a printer device that converts image data into dotted patterns for printing and outputs the dotted patterns, or an audio output apparatus that outputs audio data via a D/A converter and the like. Alternatively, the data output unit 130 may simply be an interface for transmitting data to an external device.

Upon receiving data input to the data input unit 110, the control unit 100 may process the data in the CPU 101, or may temporarily store the data as-is in the RAM 103 or the external storage device 104.

The data processing unit 120 may directly receive and process data input from the data input unit 110, or may process data upon receiving an instruction and the data from the control unit 100. The output from the data processing unit 120 may be transmitted to the control unit 100, or may be directly transmitted to the data output unit 130. The details of processing of the data processing unit 120 are set by the control unit 100 in advance, and the data processing unit 120 executes processing that has been set in correspondence with supplied data.

(Configuration of Data Processing Unit)

Figure 2:
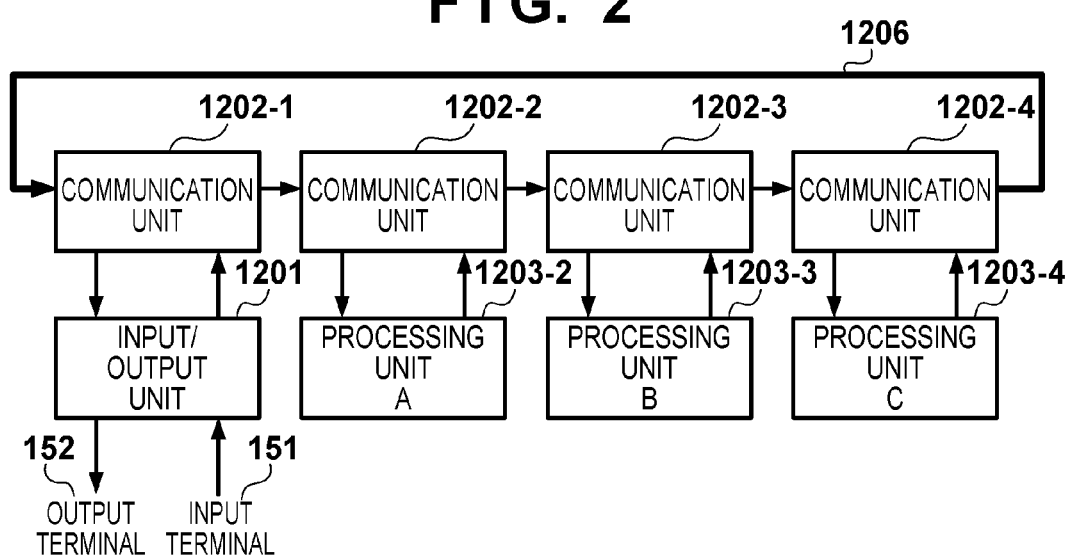
FIG. 2 shows a configuration of a data processing unit.

FIG. 2 is a block diagram showing an example of a configuration of the data processing unit 120 pertaining to the present embodiment, presenting a schematic configuration of a data path control mechanism in which processing modules are connected by a ring-shaped bus. Hereinafter, the ring-shaped bus is referred to as a "ring bus". In FIG. 2, 1201 denotes a data input/output unit, 1202-1 to 1202-4 denote communication units, and 1203-2 to 1203-4 denote data processing units that are provided in one-to-one correspondence with the communication units 1202-2 to 1202-4.

Each of the communication units 1202-1 to 1202-4 is connected to a neighboring communication unit (note, the communication unit 1202-4 is connected to the communication unit 1202-1), and transmits data received from a certain direction (first direction) to the other direction (second direction) as a part of the ring bus 1206. That is to say, the communication units 1202-1 to 1202-4 constitute the ring bus 1206 and exchange data between the ring bus 1206 and the input/output unit 1201 or the processing units 1203.

Data input from an input terminal 151 is input to the communication unit 1202-1 via the input/output unit 1201. The input data is packetized and carried over the ring bus 1206 in one direction. The communication units 1202 import necessary packets from the ring bus 1206 in accordance with information that has been set in advance, extract data from the imported packets, and input the extracted data to the processing units 1203 if the processing units 1203 can process the extracted data. The processing units 1203 execute predetermined data processing (e.g. color space conversion and resolution conversion) and output the processed data to the communication units 1202. If the processed data can be output to the ring bus 1206, it is packetized by the communication units 1202 and transmitted to the ring bus 1206. In this way, with the communication units 1202-2 to 1202-4 appropriately importing data and transmitting the processed data in the set order, the processing units 1203-2 to 1203-4 process the data in sequence. When data processing set in correspondence with data is completed, the data is imported by the communication unit 1202-1 and output from an output terminal 152 via the input/output unit 1201. Note that the processing units 1203-2 to 1203-4 execute processes A, B and C, respectively.

Note that the input/output unit 1201 serves as an interface for an external device (or module), and may be omitted if the communication unit 1202-1 can directly exchange information with the external device. Furthermore, the input/output unit 1201 may serve both as an input unit and an output unit like it is in the present embodiment. Alternatively, an input unit and an output unit may be connected to different communication units 1202 on the ring bus, respectively. Furthermore, a plurality of input units and output units may be provided.

(Data Structure of Packet)

Figure 3:
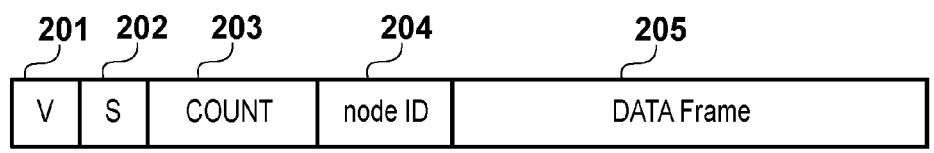
FIG. 3 shows a structure of a packet pertaining to the first embodiment.

FIG. 3 shows a data structure of a packet carried over the ring bus 1206. In FIG. 3, 201 denotes a valid flag indicating that the packet is valid, 202 denotes a stall flag indicating that the packet has been received and suspended, 203 denotes a count value indicating the order of transmission of data, 204 denotes a node ID indicating a connection ID for identifying logical connection of data, and 205 denotes data that is input or output to the communication units.

The communication units 1202 analyze a packet transmitted to the ring bus 1206 and determine whether or not the valid flag 201 is valid and whether or not the ID 204 and the count value 203 match the values managed in the communication units 1202. When the values match, the communication units 1202 determine whether or not the processing units 1203 directly connected thereto can process the received data. That is to say, in the case of the communication unit 1202-2 shown in FIG. 2, it determines whether or not the corresponding processing unit 1203-2 can process the data. When determining that the corresponding processing units 1203 can process the data, the communication units 1202 transmit the data included in the packet to the corresponding processing units 1203. At the same time, each communication unit 1202 transmits a packet in which the valid flag 201 and the stall flag 202 are set to be invalid (hereinafter referred to as an "empty packet") to another communication unit 1202 that is connected thereto and downstream thereof (in the subsequent stage) along the ring bus 1206.

Under certain setting, even when the data is transmitted to the processing units 1203, the packet may be transmitted downstream with the valid flag 201 remaining to be valid. Hereinafter, this setting is referred to as "erase mode". In the case where the erase mode is invalid, each communication unit 1202 transmits the packet in which the valid flag 201 remains to be valid to another communication unit 1202 that is connected thereto and downstream thereof, even when the data is transmitted to the corresponding processing unit 1203. This setting is used in the branch process, which will be described later. However, the stall flag 202 is set to be invalid. The above operation prevents a suspended packet, which will be described later, from being needlessly retained on the ring bus 1206.

There are cases where data in the packet received by the communication units 1202 cannot be processed by the processing units 1203 corresponding to the communication units 1202, even when the valid flag 201 is valid and the ID 204 and the count value 203 match the values managed in the communication units 1202. In such cases, a packet in which the stall flag 202 is validated (hereinafter referred to as a suspended packet) is transmitted to the ring bus 1206. Similarly, the communication units 1202 transmit the suspended packet to the ring bus 1206 also when the valid flag 201 is valid and the ID 204 matches the value managed in the communication units 1202 but the count value 203 does not match the value managed in the communication units 1202. On the other hand, in the case where the valid flag 201 in the received packet is valid but the ID 204 in the received packet does not match the value managed in the communication units 1202, the communication units 1202 transmit the packet as-is to the ring bus 1206 without changing the contents of the packet.

The communication unit 1202-1 manages two pairs of ID and count value that are referenced when determining whether or not they match the ID 204 and the count value 203 in the input packet. In this way, packets that have been processed through two data flows can be received and output to the output terminal 152 in the branch process described later.

Figure 4:
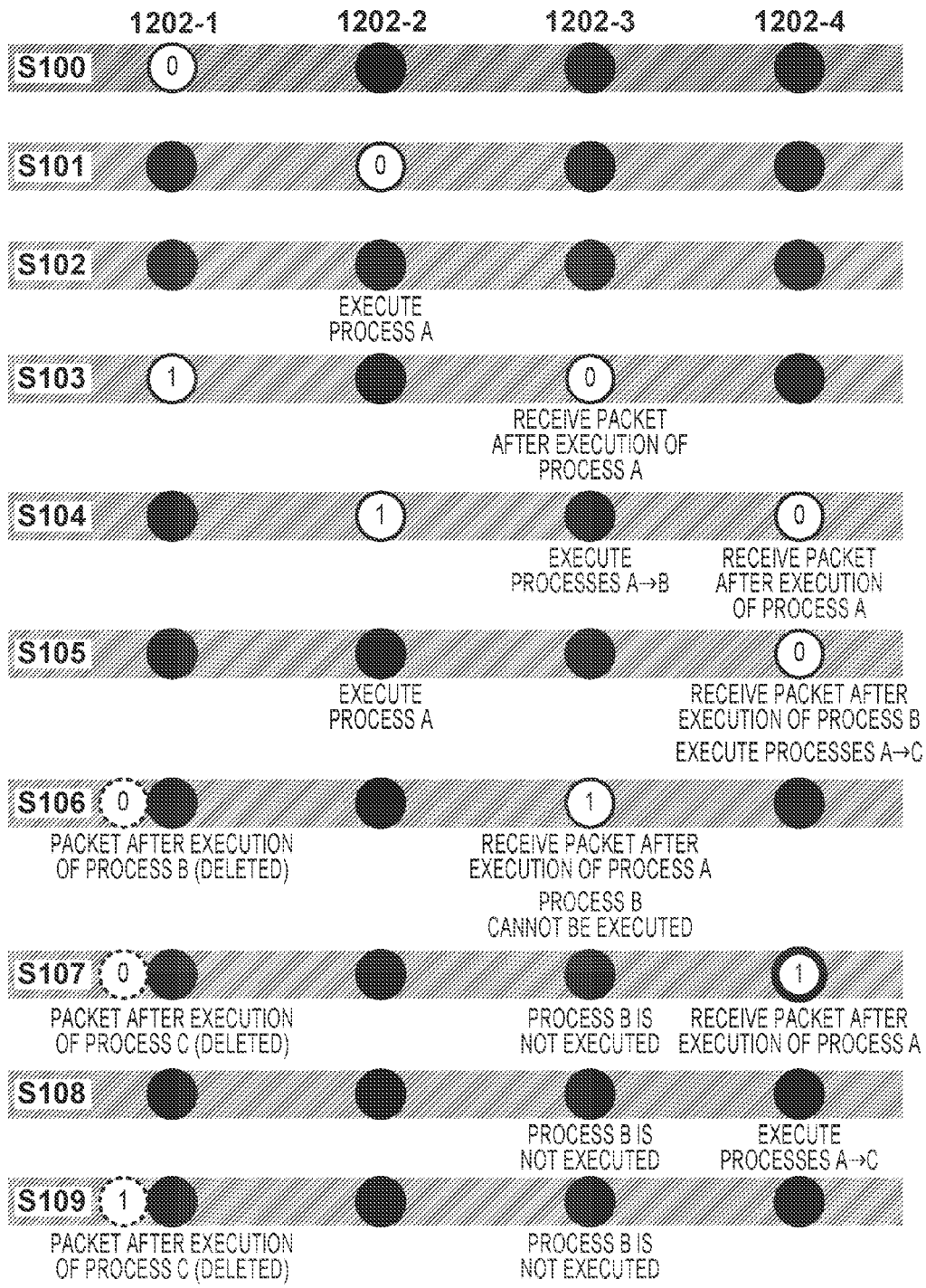
FIG. 4 shows operations of a conventional data path control mechanism.

With reference to FIG. 4, the following describes a specific example of operations of the data path control mechanism shown in FIG. 2 for the case of the branch process where two processes A→B and A→C are simultaneously executed. Note that in FIG. 4, the numbers enclosed in circles denote valid packets (in which the valid flag 201 is valid), and the numbers in the circles denote the count value 203 in the packets. Also, filled circles denote empty packets, and a circle with a bold outline denotes a packet in which the stall flag 202 is valid.

First, the CPU (not shown in the figure) or the like sets the value of ID stored in the communication units 1202 to a value for execution of the branch process. That is to say, in the communication unit 1202-2, the value of ID is set so as to process data input from the communication unit 1202-1 via the input/output unit 1201. Furthermore, in the communication units 1202-3 and 1202-4, the value of ID is set so as to process data that has been processed by the processing unit 1203-2 corresponding to the communication unit 1202-2. Moreover, in the communication unit 1202-3, the erase mode is set to be invalid. In this way, a valid packet can be output to the communication unit 1202-4 that is downstream of the communication unit 1202-3, even when the data is transmitted to the processing unit 1203-3 as the processing unit 1203-3 can process the data. In any other communication unit 1202, the erase mode is set to be valid.

First, the communication unit 1202-1 acquires data from the input terminal 151 via the input/output unit 1201 (S100). The acquired data is packetized and input to the communication unit 1202-2 via the ring bus 1206 (S101). At this time, the valid flag 201 is valid and the stall flag 202 is invalid in the packet. Data in the input packet is input to the processing unit 1203-2 because the valid flag 201 in the input packet is valid, the ID 204 and the count value 203 in the input packet match the values managed in the communication unit 1202-2, and the processing unit 1203-2 can process the data. The processing unit 1203-2 executes process A (S102). The processed data is output to the ring bus 1206 as a packet and input to the communication unit 1202-3 (S103).

The communication unit 1202-3 outputs data in the input packet to the processing unit 1203-3 because the valid flag 201 in the input packet is valid, the ID 204 and the count value 203 in the input packet match the values managed in the communication unit 1202-3, and the processing unit 1203-3 can process the data. The processing unit 1203-3 executes process B on the input data (S104). At the same time, as the erase mode is invalid in the communication unit 1202-3, the input packet is output as-is to the communication unit 1202-4 that is downstream of the communication unit 1202-3 (S104). The data processed by the processing unit 1203-3 is output to the ring bus 1206 as a packet (S105), and the data is output to the output terminal 152 via the communication unit 1202-4, the communication unit 1202-1 and the input/output unit 1201 (S106).

The packet that was input to the communication unit 1202-3 and output therefrom as-is is input to the communication unit 1202-4 (S104). Data included in the input packet is input to the processing unit 1203-4 and process C is executed on the data because the valid flag 201 in the input packet is valid, the ID 204 and the count value 203 in the input packet match the values managed in the communication unit 1202-4, and the processing unit 1203-4 can process the data (S105). The processed data is output to the ring bus 1206 as a packet, and output to the output terminal 152 via the communication unit 1202-1 and the input/output unit 1201 (S107).

A description is now given of the case where a suspended packet occurs in a similar branch process because the processing units 1203-2 and 1203-4 can process data but the processing unit 1203-3 cannot process data. Note that the following description uses a packet including the 1st data as an example. In a similar manner as the above-described example, data input from the input terminal 151 is input to the communication unit 1202-2 via the input/output unit 1201 and the communication unit 1202-1, and process A is executed on the input data (S103 to S105). The processed data is output to the ring bus 1206 as a packet and input to the communication unit 1202-3 (S106). At this time, the valid flag 201 is valid and the stall flag 202 is invalid in the packet.

The valid flag 201 in the input packet is valid, and the ID 204 and the count value 203 in the input packet match the values managed in the communication unit 1202-3. However, the processing unit 1203-3 corresponding to the communication unit 1202-3 cannot process the data. Therefore, the stall flag 202 in the input packet is set to be valid, and the input packet is transmitted to the ring bus 1206 as a suspended packet (S107).

The valid flag 201 in the packet transmitted from the communication unit 1202-3 is valid, the ID 204 and the count value 203 in the packet match the values managed in the communication unit 1202-4, and the processing unit 1203-4 corresponding to the communication unit 1202-4 can process data in the packet. Therefore, the data in the packet is input to the processing unit 1203-4, and process C is executed on the data (S108). On the other hand, as the erase mode is valid in the communication unit 1202-4, the communication unit 1202-4 outputs an empty packet to the communication unit 1202-1 via the ring bus 1206 (S108). Thereafter, the data processed by the processing unit 1203-4 is output to the ring bus 1206 as a packet, and then output to the output terminal 152 via the communication unit 1202-1 (S109).

In the present example, process B cannot be executed because the suspended packet that was input from the communication unit 1202-3 to be processed in process B was deleted and an empty packet was generated. As such, the problem with the branch process is that data for which processing has been suspended in another branch may be deleted. In view of this, the present embodiment provides a configuration for handling the above problem.

(Configuration of Communication Unit)

Figure 5:
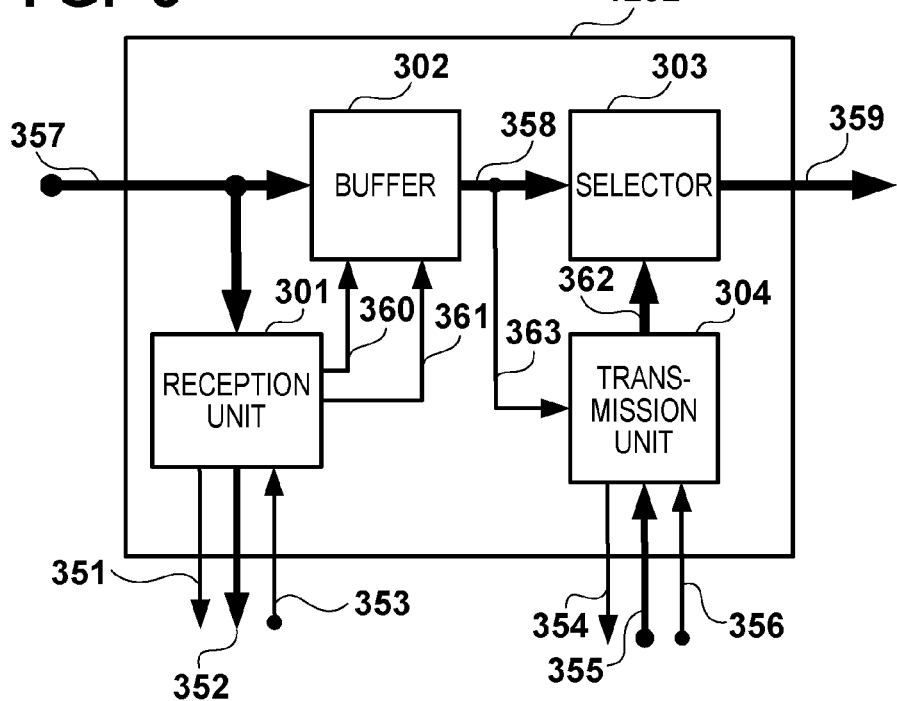
FIG. 5 shows a configuration of a communication unit pertaining to the first embodiment.

FIG. 5 is a block diagram showing a schematic configuration of a communication unit 1202. As shown in FIG. 5, the communication unit 1202 includes a reception unit 301, a buffer 302, a selector 303, and a transmission unit 304. The communication unit 1202 also includes an input terminal 357 and an output terminal 359 via which it is connected to neighboring communication units 1202. More specifically, the input terminal 357 and the output terminal 359 are respectively connected to the output terminal 359 and the input terminal 357 of the neighboring communication units 1202. The plurality of communication units 1202-1 to 1202-4 are connected by the ring bus 1206 in this manner. In the following description, a neighboring communication unit 1202 on the ring bus 1206 is referred to as an upstream neighboring communication unit 1202 if it is connected via the input terminal 357, and as a downstream neighboring communication unit 1202 if it is connected via the output terminal 359. The communication unit 1202 also includes signal lines 351 to 356 via which it is connected to a corresponding processing unit 1203 (one of the processing units 1203-2 to 1203-4).

A packet input from an upstream neighboring communication unit 1202 is temporarily held in the buffer 302, and output to the selector 303 in the next clock cycle. The reception unit 301 monitors the packet from the input terminal 357 and determines whether or not the valid flag 201 is valid and whether or not the ID 204 and the count value 203 match the values held in the reception unit 301. The reception unit 301 also determines whether or not the processing unit 1203 connected thereto can process data. More specifically, if the stall signal is not valid on the signal line 353, the reception unit 301 determines that the processing unit 1203 can process the data and therefore the data can be input to the processing unit 1203.

The reception unit 301 imports the data in the input packet if the data can be input to the processing unit 1203, the valid flag 201 in the input packet is valid, and the ID 204 and the count value 203 in the input packet match the values held in the reception unit 301. At this time, the reception unit 301 validates the valid signal on the signal line 351 and outputs the imported data to the processing unit 1203 via the signal line 352. Furthermore, once the data in the packet has been imported, the reception unit 301 increments the count value appended to the data managed in the reception unit 301. At the same time, the reception unit 301 executes control to clear (invalidate) the valid flag 201 in the packet stored in the buffer 302 via a signal line 360. The reception unit 301 also sets the value of the stall flag 202 in the packet stored in the buffer 302 via a signal line 361. The specifics of operations for the above control will be described later.

Via a signal line 363, the transmission unit 304 monitors the valid flag 201 in the packet output from the buffer 302 to a signal line 358. When the valid flag 201 is valid, the packet output from the buffer 302 is preferentially output to the output terminal 359, and therefore the transmission unit 304 cannot output the packet including the data from the processing unit 1203. Hence, the transmission unit 304 validates the stall signal via the signal line 354 to suspend the output of the data from the processing unit 1203. When the valid flag 201 in the packet output from the buffer 302 is invalid, the transmission unit 304 invalidates the stall signal via the signal line 354 and receives the data from the processing unit 1203. When the valid flag 201 of the packet on the signal line 358 is valid, the selector 303 selects and outputs the output from the buffer 302.

When the processing unit 1203 can output the data (when the valid signal is valid on the signal line 356), the transmission unit 304 validates the valid flag 201 on a signal line 362. Then, the transmission unit 304 generates a packet to which the count value managed therein and the connection ID set in the register are added, and outputs the generated packet to the selector 303 via the signal line 362. When the valid flag 201 is invalid on the signal line 358, the selector 303 selects the signal line 362, i.e. the output from the transmission unit 304, and transmits the packet generated by the transmission unit 304 to the ring bus 1206 via the output terminal 359. Although the packet is described herein as being generated, conceptually it means that the data is stored in an empty packet carried over the ring bus 1206. After the packet is output, the aforementioned count value is incremented.

(Configuration of Reception Unit)

Figure 6:
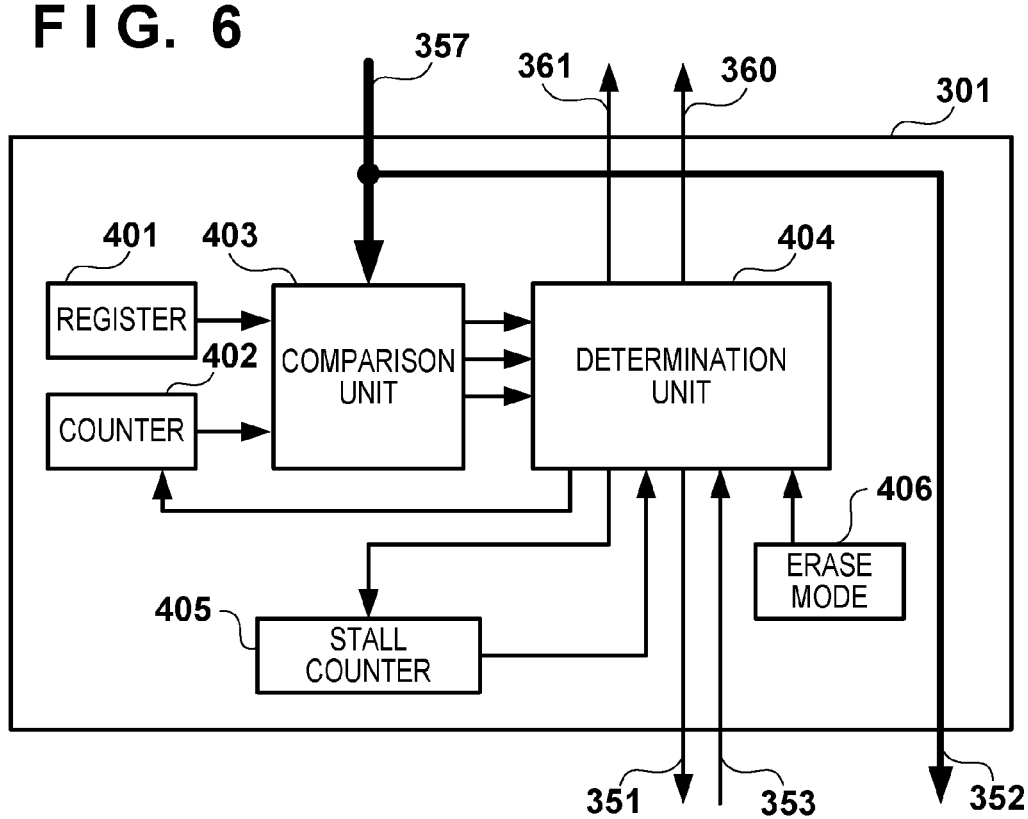
FIG. 6 shows a configuration of a reception unit pertaining to the first embodiment.

FIG. 6 is a block diagram showing a schematic configuration of the reception unit 301. As shown in FIG. 6, the reception unit 301 includes a register 401 (storage unit), a counter 402, a comparison unit 403, a determination unit 404 (switch unit), a stall counter 405, and an erase mode register 406.

The register 401 stores therein the connection ID. When this connection ID matches the ID 204 in a received packet, it means that the processing unit 1203 connected to the reception unit 301 should process data included in the received packet. The counter 402 manages the order of data to be processed. When the count value 203 in the received packet matches the value in the counter 402, it means that the received packet includes data that should be processed next by the processing unit 1203 connected to the reception unit 301.

The comparison unit 403 monitors the valid flag 201, the stall flag 202, the ID 204, and the count value 203 in the received packet. If the valid flag 201 in the received packet is valid, the comparison unit 403 checks, through comparison, whether or not the ID 204 in the received packet matches the connection ID stored in the register 401, and whether or not the count value in the received packet matches the value in the counter 402. The comparison unit 403 outputs, to the determination unit 404, a connection ID match signal if the ID 204 matches the connection ID, and a count value match signal if the count value matches the value in the counter 402, in "valid" state. Furthermore, if the stall flag 202 in the input packet is valid, the comparison unit 403 outputs a stall valid signal to the determination unit 404.

The determination unit 404 determines a process to be executed based on the connection ID match signal, the count value match signal, the stall valid signal, the stall signal of the processing unit 1203 via the signal line 353, the stall counter 405, and the erase mode register 406. Here, the stall signal from the signal line 353 indicates whether or not the processing unit 1203 can execute the process. When the stall signal is invalid, it means that the processing unit 1203 can execute the process and therefore import the data.

The stall counter 405 increments the count by one (adds one to the count value) when the reception unit 301 validates the stall flag 202. The stall counter 405 deducts one from the count value when the packet in which the stall flag 202 was validated is processed later. The stall counter 405 is reset when the operation is started by, for example, turning on the power. The initial value of the stall counter 405 is "0". Therefore, unless the reception unit 301 outputs a suspended packet, the value of the stall counter remains to be "0". That is to say, the stall counter 405 shows the number of packets suspended by the reception unit 301, or the number of data that has been left unprocessed after the corresponding processing unit 1203 suspended the process.

Note that the communication unit 1202 is allowed to change the value of the stall flag 202 in the received packet only when the value of the stall counter is greater than "0" and the stall flag 202 is valid, or when the stall flag 202 is invalid. More specifically, the stall flag 202 can be changed from valid to invalid only when the value of the stall counter is greater than "0" and the stall flag 202 is valid, and from invalid to valid only when the stall flag 202 is invalid.

When the erase mode is set to be valid or invalid by the control unit 100, the erase mode register 406 stores therein that setting. The value of the stall counter 405 may be cleared to "0" at timings other than the start of the operation by, for example, being reset under the instruction from the control unit 100 before the data input is started upon switching the mode (upon starting a new process).

(Operations of Reception Unit)

There are two main types of operations executed by the reception unit 301 when receiving a packet having the same ID as the connection ID stored in the register 401. These two types of operations are: (1) a accepting operation of analyzing the received packet and transmitting data 205 to the processing unit 1203 when the processing unit 1203 can process the data; and (2) a suspending operation of outputting a suspended packet to the buffer 302 when the processing unit 1203 cannot process the data. When receiving a packet having an ID that differs from the connection ID stored in the register 401, the reception unit 301 outputs the packet stored in the buffer 302 as-is to a neighboring communication unit 1202 (through).

The operation (1) is classified into the following two operations: (1-1) an operation of leaving the value of the stall flag 202 unchanged; and (1-2) an operation of changing the value of the stall flag 202. The operation (1-1) is classified into the following two operations: (1-1-1) an operation of storing an empty packet in the buffer 302; and (1-1-2) an operation of storing a valid packet in the buffer 302. Similarly, the operation (1-2) is classified into the following two operations: (1-2-1) an operation of storing an empty packet in the buffer 302; and (1-2-2) an operation of storing a valid packet in the buffer 302. On the other hand, the operation (2) is classified into the following two operations: (2-1) an operation of validating the stall flag 202; and (2-2) an operation of leaving the stall flag 202 unchanged. The determination unit 404 determines which of these operations is to be selected. These operations are explained below.

(1) Accepting Operation (1-1) Operation of Leaving Value of Stall Flag 202 Unchanged This operation is executed when the value of the stall counter 405 is "0". In other words, this operation is executed when the reception unit 301 has not output the suspended packet, or after the data that has once been suspended is all processed.

(1-1-1) Operation of Storing Empty Packet in Buffer 302

This operation is executed when the value of the stall counter 405 is 0 in the communication unit 1202 in which the erase mode is set to be valid in the state where predetermined conditions are satisfied. The predetermined conditions are: the valid flag included in the received packet is valid; the connection ID match signal and the count value match signal are both valid; the stall valid signal is invalid; and the stall signal is invalid on the signal line 353.

In order to invalidate the packet in the buffer 302, this operation executes control to clear the valid flag 201 in the packet stored in the buffer 302 via the signal line 360. At the same time, a control signal for the stall flag 202 is output to the buffer 302 via the signal line 361. There are three types of control for the stall flag, namely, set (validate), clear (invalidate), and maintain (do nothing). In the present case, as the value of the stall counter 405 is "0", a control signal for "maintain" is output.

Also, when this operation is executed, the determination unit 404 causes the counter 402 to increment the count value (add one to the count value) in the next clock cycle, so as to acquire data following the data that has been received and transmitted to the processing unit 1203. For example, the determination unit 404 may notify the counter 402 of a count valid signal in a valid state, and the counter 402 may increment the count value upon receiving that notification. At the same time, the determination unit 404 validates the valid signal on the signal line 351, and outputs the data 205 included in the packet to the processing unit 1203 via the signal line 352.

(1-1-2) Operation of Storing Valid Packet in Buffer 302

This operation is executed when the value of the stall counter 405 is 0 in the communication unit 1202 in which the erase mode is set to be valid in the state where predetermined conditions are satisfied. The predetermined conditions are: the valid flag included in the received packet is valid; the connection ID match signal and the count value match signal are both valid; the stall valid signal is valid; and the stall signal is invalid on the signal line 353. That is to say, this operation is executed when the received suspended packet has been suspended by another communication unit 1202, is to be processed by the processing unit 1203 connected to the reception unit 301, and can be processed by that processing unit 1203.

This operation is executed also when the value of the stall counter 405 is 0 in the communication unit 1202 in which the erase mode is set to be invalid in the state where predetermined conditions are satisfied. The predetermined conditions are: the valid flag included in the received packet, the connection ID match signal and the count value match signal are all valid; and the stall signal on the signal line 353 is invalid.

In this case, the determination unit 404 maintains the valid state of the valid flag 201 in the buffer 302 without clearing it. The determination unit 404 also "maintains" the stall flag 202 as the value of the stall counter 405 is "0". Other control, such as control for incrementing the count value and outputting data, is similar to the operation (1-1-1) and a description thereof is omitted.

(1-2) Operation of Invalidating Stall Flag 202

This operation is executed when the value of the stall counter 405 is not "0" in the state where predetermined conditions are satisfied. The predetermined conditions are: the valid flag included in the received packet is valid; the connection ID match signal and the count value match signal are both valid; the stall valid signal is valid; and the stall signal on the signal line 353 is invalid.

When the value of the stall counter 405 is greater than "0", it means that the reception unit 301 has output a packet in which the stall flag 202 is valid. In this state, if a packet in which the stall flag 202 is valid is received, the stall flag 202 in the buffer 302 can be invalidated by causing the processing unit 1203 to process data included in that packet. At this time, the determination unit 404 decrements the value of the stall counter 405 (deduct one therefrom) as the processing unit 1203 processes the data included in the packet in which the stall flag 202 is valid. For example, the determination unit 404 may output a count control signal including a countdown instruction to the stall counter 405 and cause the stall counter 405 to decrement the count value in the next clock cycle. Note that the smallest value of the stall counter 405 is "0". Once the value of the stall counter 405 has been decremented to "0", the stall counter 405 maintains the value "0" thereafter.

(1-2-1) Operation of Storing Empty Packet in Buffer 302

This operation is executed by a communication unit 1202 in which the erase mode is set to be valid. This operation is substantially the same as the operation (1-1-1). That is to say, this operation invalidates the valid flag 201 in the packet stored in the buffer 302. However, unlike the operation (1-1-1), the determination unit 404 outputs a control signal for clearing the stall flag 202 in the packet stored in the buffer 302. Other control, such as control for incrementing the count value and outputting data, is similar to the operation (1-1-1) and a description thereof is omitted.

(1-2-2) Operation of Storing Valid Packet in Buffer 302

This operation is executed by a communication unit 1202 in which the erase mode is set to be invalid. In this operation, the determination unit 404 outputs a control signal for clearing the stall flag 202 in the packet stored in the buffer 302, as with the operation (1-2-1). However, the determination unit 404 does not clear the valid flag 201 in the packet stored in the buffer 302, but maintains the valid state of the valid flag 201. Other control, such as control for incrementing the count value and outputting data, is similar to the operation (1-1-1) and a description thereof is omitted.

(2) Suspending Operation

When the stall signal via the signal line 353 is valid, the processing unit 1203 cannot import data, and therefore a suspending operation is executed. In this case, the determination unit 404 determines whether or not to set the stall flag 202 in the buffer 302 with reference to the stall valid signal and the value of the stall counter 405. At the same time, the determination unit 404 invalidates the valid signal on the signal line 351.

(2-1) Operation of Changing Stall Flag 202

This operation is executed when the connection ID match signal and the count value match signal are valid, the stall valid signal is invalid, and the stall signal via the signal line 353 is valid. This operation is executed also when the connection ID match signal is valid, the count value match signal and the stall valid signal are invalid, and the value of the stall counter 405 is not 0. In the former case, the stall flag in the received packet is validated because the processing unit 1203 cannot import data included in the received packet. In the latter case, the stall flag in the received packet is validated because it is thought that the reception unit 301 has suspended a packet with a count value previous to the count value of the received packet. In this case, the determination unit 404 outputs a control signal for setting the stall flag 202 in the packet stored in the buffer 302, as well as a control signal for incrementing the value of the stall counter 405 by one. In this case, the determination unit 404 invalidates the valid signal on the signal line 351 because the processing unit 1203 cannot import data. Furthermore, the value of the counter 402 remains unchanged.

(2-2) Operation of Leaving Stall Flag 202 Unchanged

This operation is executed when the connection ID match signal and the count value match signal are valid, the stall valid signal is valid, and the stall signal via the signal line 353 is valid. In this case, although a suspended packet is output, the determination unit 404 does not change the stall flag 202 because the stall flag 202 is already valid. Furthermore, the value of the stall counter 405 is not incremented, i.e. maintained.

(Configuration of Transmission Unit)

Figure 7:
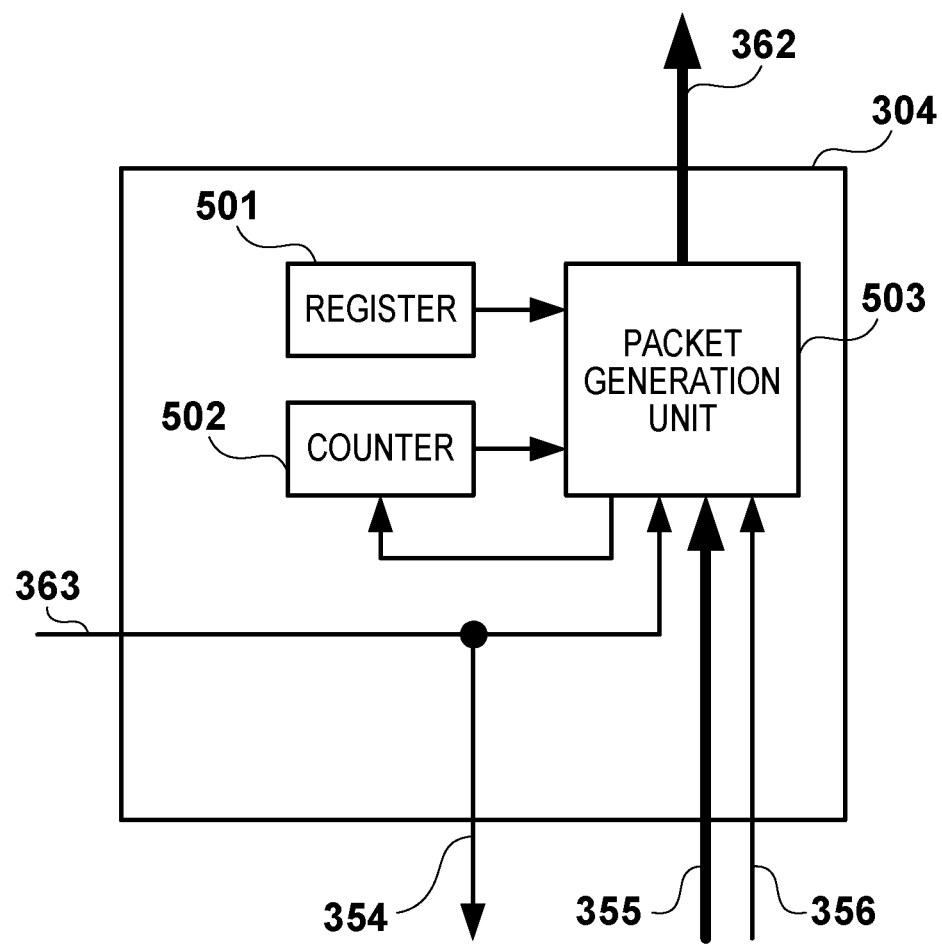
FIG. 7 shows a configuration of a transmission unit pertaining to the first embodiment.

FIG. 7 is a block diagram showing a schematic configuration of the transmission unit 304. As shown in FIG. 7, the transmission unit 304 includes a register 501 (storage unit), a counter 502, and a packet generation unit 503. The valid flag 201 in the packet output from the buffer 302 is input to the packet generation unit 503 via the signal line 363. This valid flag 201 is also output to the processing unit 1203 via the signal line 354. Furthermore, the processing unit 1203 inputs data and a data valid signal (valid signal) to the packet generation unit 503 via the signal lines 355 and 356, respectively. The packet generation unit 503 outputs the generated packet to the selector 303 via the signal line 362.

The packet generation unit 503 references the valid signal transmitted from the processing unit 1203 connected thereto via the signal line 356, and if the valid signal is valid, determines that the data output from the processing unit 1203 is possible. In the case where the packet generation unit 503 has determined that the data output from the processing unit 1203 is possible, if the valid flag 201 on the signal line 354 is invalid, the packet generation unit 503 generates a packet storing therein the count value of the counter 502 and an output connection ID set in the register 501. At this time, the packet generation unit 503 sets the valid flag and the stall flag in the generated packet to be valid and invalid, respectively, and stores them in the data 205 of the data packet processed by the processing unit 1203 via the signal line 355. The packet generation unit 503 then outputs the packet to the selector 303. In the next clock cycle, the counter 502 increments the count value (adds one to the count value). Note that the control unit 100 resets the counter 502 of the transmission unit 304 and the counter 402 of the reception unit 301 in the communication unit 1202 to the same value prior to the start of data transfer so as to ensure synchronization.

When the stall flag 202 in the received packet is invalid and the ID 204 in the received packet matches the output connection ID stored in the register 501, the communication unit 1202 considers that the packet it output was not processed in the subsequent stage, invalidates the valid flag 201, and deletes the received packet (turns the received packet into an empty packet). The communication unit 1202 deletes the received packet because the packet it output was not processed in the subsequent stage and no processing was suspend, that is to say, it can be judged that there is no longer any module that should process data included in that packet.

(Operations of Data Path Control Mechanism)

Figure 8A:
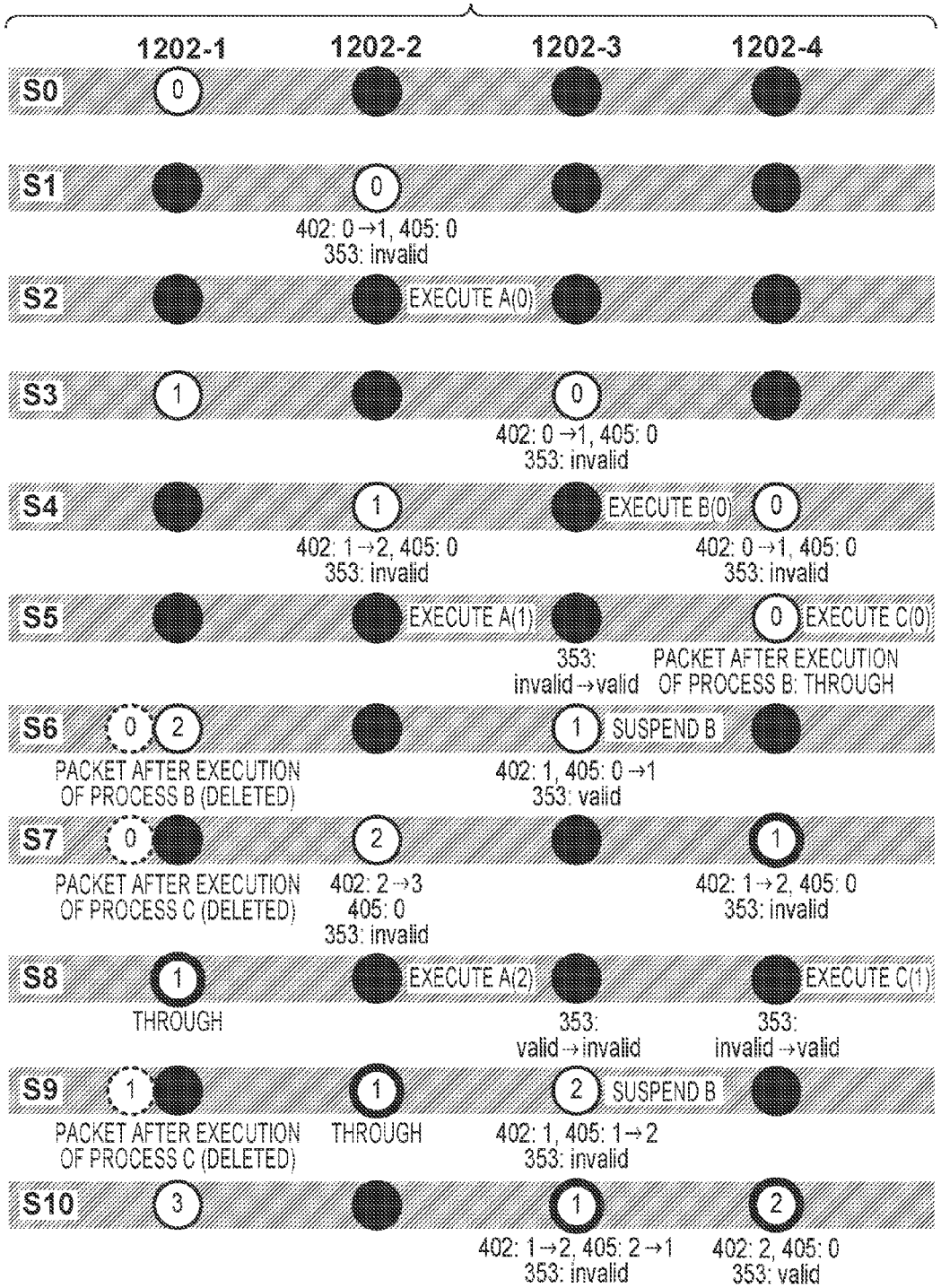
FIG. 8A shows operations of a data path control mechanism pertaining to the first embodiment.
Figure 8B:
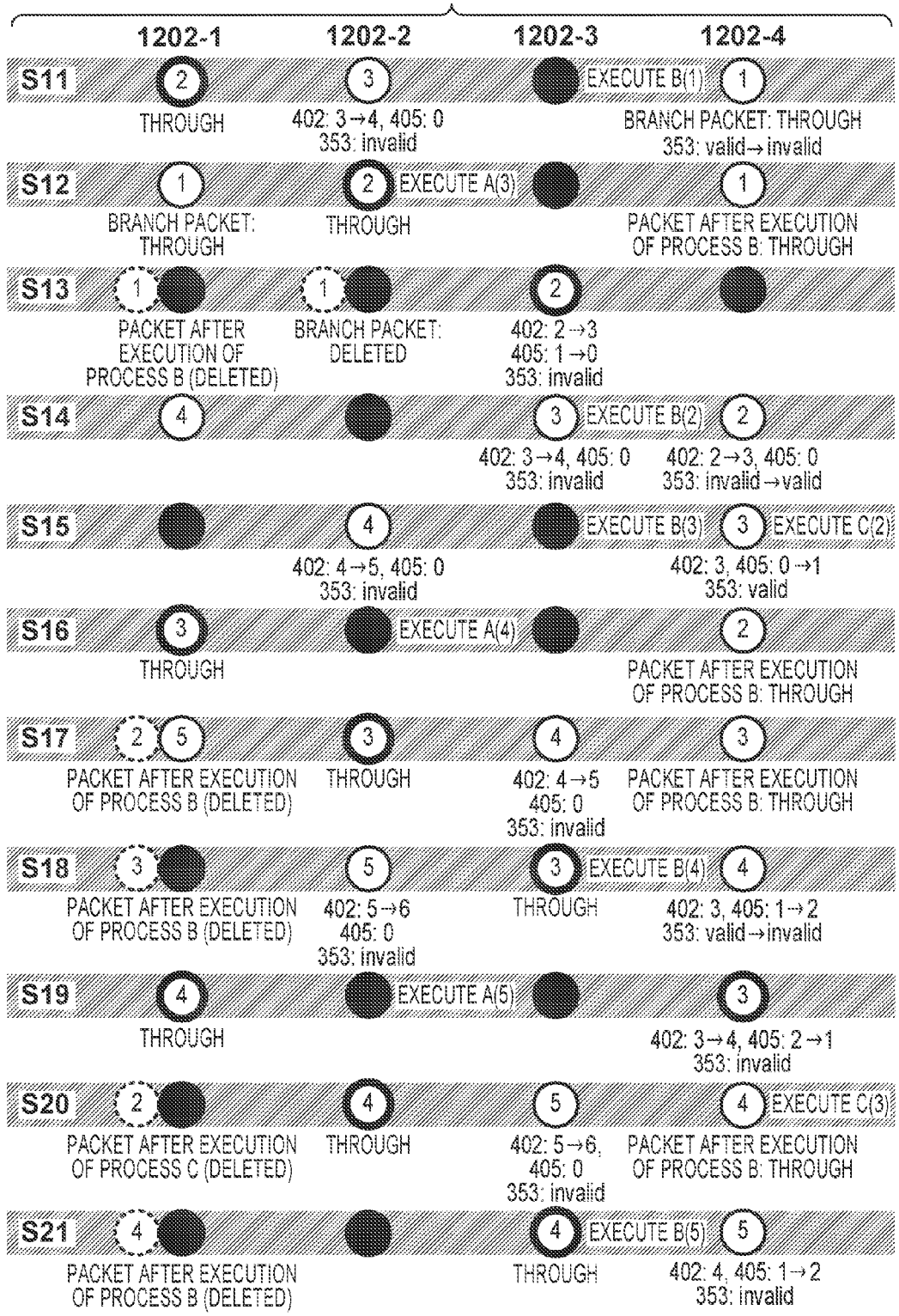
FIG. 8B shows operations of the data path control mechanism pertaining to the first embodiment.

With reference to FIGS. 8A and 8B, the following describes operations of the branch process in the data path control mechanism configured as shown in FIG. 2 using the communication units 1202 pertaining to the present embodiment shown in FIGS. 5 to 7. In FIGS. 8A and 8B, the statuses of the reception units 301 in the communication units 1202-1 to 1202-4 are shown in accordance with processing steps. As the branch process, processes A→B and A→C are executed in parallel. Note that the following description is given under the assumption that the control unit 100 has set the registers 401 and 501 in the communication units 1202-1 to 1202-4 to values for execution of the branch process. Furthermore, the erase mode register 406 is set to be invalid in the communication unit 1202-3 and valid in the other communication units.

Note that in FIGS. 8A and 8B, the numbers enclosed in circles denote valid packets (packets in which the valid flag 201 is valid), the numbers in the circles denote the count value 203 in the packets, and circles with a bold outline denote packets in which the stall flag 202 is valid. The numbers 402, 405, and 353 below the valid packets respectively indicate the value of the counter 402, the value of the stall counter 405, and the state of the stall signal input via the signal line 353. In order to simplify the description, it is assumed here that the processing unit 1203-2 and the input/output unit 1201 can always process data, and the communication units 1202-2 and 1202-1 do not output a suspended packet.

Furthermore, in FIGS. 8A and 8B, the state of the signal line 353 is indicated as "invalid" or "valid", where "invalid" means that the stall valid signal on the signal line 353 is invalid and data can be processed, and "valid" means that the stall valid signal on the signal line 353 is valid and data cannot be processed.

First, the 0th data is input from the input terminal 151 (S0), and a packet including the 0th data is output from the communication unit 1202-1. Upon receiving the packet transmitted from the communication unit 1202-1, the communication unit 1202-2 imports the 0th data included in the received packet as the processing unit 1203-2 can process data (the signal line 353 is invalid). The communication unit 1202-2 adds one to (increments) the value of the counter 402. As a result, the value of the counter 402 is set to "1" (S1). The communication unit 1202-2 transmits the data to the processing unit 1203-2 and outputs an empty packet (S2). The processing unit 1203-2 processes the data (S2). After process A has been executed, the communication unit 1202-2 packetizes the data and outputs the packetized data to the ring bus 1206 (S3). Note that this receiving operation corresponds to the above-described operation (1-1-1).

As the processing unit 1203-3 can process data (the signal line 353 is invalid), the communication unit 1202-3 imports the 0th data, which was processed by the processing unit 1203-2, from the received packet and increments the value of the counter 402 to "1" (S3). As the erase mode is invalid in the communication unit 1202-3, the communication unit 1202-3 transmits the data to the processing unit 1203-3 and outputs the received valid packet to the ring bus 1206 (S4). The processing unit 1203-3 executes process B on the received data (S4). The processed data is output to the communication unit 1202-3. The communication unit 1202-3 packetizes this data and outputs the packetized data to the ring bus 1206 (S5). This operation corresponds to the above-described operation (1-1-2). Thereafter, the packet including this processed data passes through the communication unit 1202-4 (S5). The processed data is output to the output terminal 152 via the communication unit 1202-1, and the packet is deleted (S6). It is assumed here that after executing process B, the processing unit 1203-3 becomes incapable of processing data (the signal line 353 becomes valid).

As the processing unit 1203-4 can process data (the signal line 353 is invalid), the communication unit 1202-4 imports the packet including the 0th data that was processed by the processing unit 1203-2, and increments the value of the counter 402 to "1" (S4). The processing unit 1203-4 executes process C on the data imported by the communication unit 1202-4, and returns the processed data to the communication unit 1202-4 (S5). The communication unit 1202-4 packetizes the received data and outputs the packetized data to the ring bus 1206. Note that as the communication unit 1202-4 transfers the packet received from the communication unit 1202-3 in S6, the packet including the data on which process C was executed is output to the ring bus 1206 in S7. This operation corresponds to the above-described operation (1-1-1). The processed data in the output packet is output to the output terminal 152 via the communication unit 1202-1, and the packet is deleted (S7).

A description is now given of a packet including the 1st data (a packet whose count value 203 is 1). The 1st data is input from the input terminal 151 and packetized by the communication unit 1202-1 in S3. The 1st data is then output to the ring bus 1206 (S4). As the processing unit 1203-2 can process data, the communication unit 1202-2 imports the data from this packet and increments the value of the counter 402 to "2" (S4). Then, the imported data is output to the processing unit 1203-2. The processing unit 1203-2 executes process A on this data (S5). The processed data is input to the communication unit 1202-2. The communication unit 1202-2 packetizes this data and outputs the packetized data to the ring bus 1206 (S6). Note that this receiving operation also corresponds to the above-described operation (1-1-1).

As the processing unit 1203-3 cannot process data (the signal line 353 is valid), the communication unit 1202-3 cannot import the packet including the 1st data that was processed by the processing unit 1203-2 (S6). Therefore, the communication unit 1202-3 increments the value of the stall counter 405 to "1" and validates the stall flag 202 in the packet in the buffer 302 (S6). This operation corresponds to the above-described operation (2-1).

As the processing unit 1203-4 can process data, the communication unit 1202-4 imports the packet including the 1st data that was processed by the processing unit 1203-2, and increments the value of the counter 402 to "2" (S7). Then, the communication unit 1202-4 inputs the imported data to the processing unit 1203-4, and outputs the packet in the buffer 302 to the ring bus 1206 without changing the valid flag 201 and the stall flag 202 (S8). This operation corresponds to the above-described operation (1-1-2). The processing unit 1203-4 executes process C on the input data and returns the processed data to the communication unit 1202-4 (S8). The communication unit 1202-4 packetizes the processed data and outputs the packetized data to the ring bus 1206. The processed data is output to the output terminal 152 via the communication unit 1202-1 and deleted (S9).

It is assumed here that, in parallel with the 1st data, the 2nd data is input from the input terminal 151 in S6. The input data is packetized by the communication unit 1202-1 and output to the ring bus 1206 (S7). As the processing unit 1203-2 can process data, the communication unit 1202-2 imports data from this packet and increments the value of the counter 402 to "3" (S7). Then, the imported data is output to the processing unit 1203-2. The processing unit 1203-2 executes process A on this data (S8). The processed data is input to the communication unit 1202-2. The communication unit 1202-2 packetizes this data and outputs the packetized data to the ring bus 1206 (S9). Note that this receiving operation also corresponds to the above-described operation (1-1-1).

It is assumed here that the processing unit 1203-3 became capable of processing data in S8. As the processing unit 1203-3 can process data, the communication unit 1202-3 compares the ID and the count value in the received packet with the values stored in the communication unit 1202-3. In this case, however, the count value 203 in the received packet (2) differs from the value of the counter 402 (1). Here, the value of the stall counter 405 is incremented to "2" because the connection ID match signal is valid, the count value match signal and the stall valid signal are invalid, and the stall counter is not 0 (S9). After the stall flag 202 in the packet in the buffer 302 is validated, this packet is output to the ring bus 1206. This operation corresponds to the above-described operation (2-1).

Thereafter, the communication unit 1202-3 receives the packet including the 1st data, which was suspended earlier (S10). As the processing unit 1203-3 can process data at this point, the count value is incremented and the stall count is decremented. Furthermore, the stall flag 202 in the packet stored in the buffer 302 is cleared. However, the valid flag is not cleared. This operation corresponds to the above-described operation (1-2-2). Then, the data is extracted from this packet and output to the processing unit 1203-3. The processing unit 1203-3 executes process B on this data (S11) and returns the processed data to the communication unit 1202-3. The communication unit 1202-3 packetizes the received processed data and outputs the packetized data to the ring bus 1206 (S12). After this packet passes through the communication unit 1202-4 (S12), it is output from the output terminal 152 via the communication unit 1202-1 and then deleted (S13). When the branch packet in which the stall flag 202 has been cleared reaches the communication unit 1202-2, it is deleted (the valid flag is cleared) (S13). This is because the communication unit 1202-2 considers that the packet it output was not processed in the subsequent stage since the stall flag 202 is invalid and the ID 204 matches the output connection ID stored in the register 501.

Furthermore, the communication unit 1202-4 receives the packet including the 2nd data, which was suspended by the communication unit 1202-3 and output to the ring bus 1206 (S10). It is assumed here that the processing unit 1203-4 became incapable of processing data in S8. In this case, the above-described operation (2-2) is executed because the connection ID match signal, the count value match signal and the stall valid signal are all valid and the stall signal from the processing unit 1203-4 is valid. That is to say, the communication unit 1202-4 outputs the packet in the buffer 302 to the ring bus 1206 without changing the stall flag 202, and the value of the stall counter 405 is maintained (S10).

After the packet including the 2nd data passes through the communication units 1202-1 and 1202-2 (S11, S12), it is received by the communication unit 1202-3. As the processing unit 1203-3 can process data, the communication unit 1202-3 imports the 2nd data from the received packet and increments the value of the counter 402 to "3" (S13). The stall counter 405 is decremented. After the stall flag 202 in the packet stored in the buffer 302 is invalidated, this packet is output to the ring bus 1206 without changing the valid flag (S14). This operation corresponds to the above-described operation (1-2-2).

The data imported by the communication unit 1202-3 is output to the processing unit 1203-3. The processing unit 1203-3 executes process B on this data (S14). The processing unit 1203-3 outputs the processed data to the communication unit 1202-3. The communication unit 1202-3 packetizes the processed data and outputs the packetized data to the ring bus 1206 (S16). Thereafter, the processed data in this packet is output to the output terminal 152 via the communication units 1202-4 and 1202-1, and this packet is deleted (S17). This packet was not transmitted in S15 because the valid packet including the 3rd data was stored in the buffer 302 and preferentially transmitted.

Note that the packet in which the stall flag 202 was invalidated in S13 is received by the communication unit 1202-4 (S14). The communication unit 1202-4 imports data from this packet because the valid flag in this packet, the connection ID match signal and the count value match signal are all valid, the stall valid signal is invalid, and the processing unit 1203-4 can process data. The value of the counter 402 is incremented to "3" (S14). This operation corresponds to the above-described operation (1-1-1). Then, the imported data is output to the processing unit 1203-4. The processing unit 1203-4 executes process C on this data (S15). The processed data is input to the communication unit 1202-4. The communication unit 1202-4 packetizes this data and outputs the packetized data to the ring bus 1206 (S20). Note that this packet was not output to the ring bus 1206 in S16 to S19 because valid packets were consecutively input to the buffer 302 and preferentially output. The packet output to the ring bus 1206 is received by the communication unit 1202-1. After the data included in this packet is output to the output terminal 152, this packet is deleted.

In S10, the 3rd data is input from the input terminal 151. The communication unit 1202-1 packetizes this data and outputs the packetized data to the ring bus 1206 (S11). As the processing unit 1203-2 can process data, the communication unit 1202-2 imports the packet including the 3rd data and increments the value of the counter 402 to "4". This operation also corresponds to the above-described operation (1-1-1). The communication unit 1202-2 imports the data from this packet and outputs the data to the processing unit 1203-2. The processing unit 1203-2 executes process A on the data and returns the processed data to the communication unit 1202-2 (S12). The communication unit 1202-2 packetizes the received data and outputs the packetized data to the ring bus 1206 (S14). Note that this packet was not output in S13 because the packet including the 2nd data, which was suspended by the communication unit 1202-3, was preferentially output.

As the processing unit 1203-3 can process data, the communication unit 1202-3 imports the packet including the 3rd data and increments the value of the counter 402 to "4". The communication unit 1202-3 outputs the imported data to the processing unit 1203-3. The processing unit 1203-3 executes process B on this data (S15). As the erase mode is invalid in the communication unit 1202-3, the communication unit 1202-3 maintains the valid flag in the packet stored in the buffer 302 as-is and outputs this packet to the ring bus 1206 (S15). This operation corresponds to the above-described operation (1-1-2). The processed data is returned to the communication unit 1202-3. The communication unit 1202-3 packetizes this data and outputs the packetized data to the ring bus 1206 (S17). The packet output to the ring bus 1206 is received by the communication unit 1202-1. After the data included in this packet is output to the output terminal 152, this packet is deleted (S18).

The communication unit 1202-4 receives the packet for the branch process, which was output from the communication unit 1202-3 (S15). It is assumed here that, after the operation of S14, the processing unit 1203-4 became incapable of processing data. As the processing unit 1203-4 cannot process data, the communication unit 1202-4 cannot import the data included in the received packet. Therefore, the value of the stall counter 405 is incremented to "1". After the stall flag 202 in the packet stored in the buffer 302 is validated, this packet is output to the ring bus 1206 (S16). This operation corresponds to the above-described operation (2-1).

The packet including the 3rd data, which was suspended by the communication unit 1202-4, passes through the communication units 1202-1 to 1202-3 (S16 to S18), and is received by the communication unit 1202-4 again (S19). It is assumed here that the processing unit 1203-4 became capable of processing data before receiving the packet. As the processing unit 1203-4 can process data, the communication unit 1202-4 imports the data included in the packet, increments the count value, and decrements the stall count (S19). At this time, as the erase mode is valid in the communication unit 1202-4, the communication unit 1202-4 invalidates the valid flag in the packet stored in the buffer 302. This operation corresponds to the above-described operation (1-2-1). The imported data is input to the processing unit 1203-4. The processing unit 1203-4 executes process C on this data (S20). The processed data is returned to the communication unit 1202-4. The communication unit 1202-4 packetizes this data and outputs the packetized data to the ring bus 1206 (not shown in the figures).

The packets including the 4th data and the 5th data are processed in a similar manner as the above-described operations. As set forth above, by identifying a communication unit 1202 that executed the suspending operation based on the value of the stall counter 405, a suspended packet output from a module is not deleted by modules in other branches. In this way, the branch process can be normally executed in a data path control mechanism using a ring bus. It suffices for the stall counter 405 to have the number of bits that allows counting from the state where there is no suspended packet (the count value is "0") through the state where all the empty packets on the ring bus have been expelled. For example, in the present embodiment, it suffices for the stall counter 405 to have 3 bits as there are four communication units 1202 on the ring bus 1206.

Second Embodiment

A description is now given of the second embodiment as one embodiment of the present invention. In the second embodiment, an information processing apparatus and a data processing unit therein have the configurations shown in FIGS. 1 and 2 as with the first embodiment.

(Data Structure of Packet)

Figure 9:
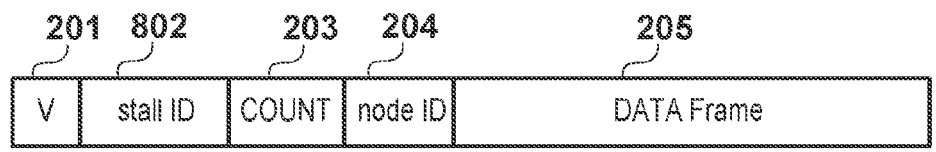
FIG. 9 shows a structure of a packet pertaining to the second embodiment.

FIG. 9 shows a data structure of a packet carried over a ring bus 1206. The components of FIG. 9 that have the same functions as those in FIG. 2 pertaining to the first embodiment are given the same reference signs thereas, and a description thereof is omitted. FIG. 9 differs from FIG. 2 in that the stall flag 202 is replaced by a stall ID 802. The stall ID 802 is an area for storing a number of a branch from which a suspended packet has been output. For example, in the case of a branch process where processes A→B and A→C are executed, there are two branches, namely processes B and C. In order to identify these branches, the branch numbers are stored in stall ID registers 1005 in communication units 1202. The stall ID registers 1005 will be described later. Therefore, in this case, the stall ID 802 may be any information for identifying in which one of processes B and C the process was suspended. For the sake of explanation, "1", "1", "2", and "3" are respectively stored in correspondence with the branches of input/output, process A, process B, and process C. When a suspended packet is output from each branch, the branch number in the corresponding stall ID register 1005 is stored in the stall ID 802 of the packet. Note that when the stall ID 802 is "0", it means that the packet is not the suspended packet.

In the present embodiment, the communication units 1202 have the configuration shown in FIG. 5 as with the first embodiment. However, in the present embodiment, a signal line 361 is used to set the stall ID 802 in the packet stored in the buffer 302.

(Configuration and Operations of Reception Unit)

Figure 10:
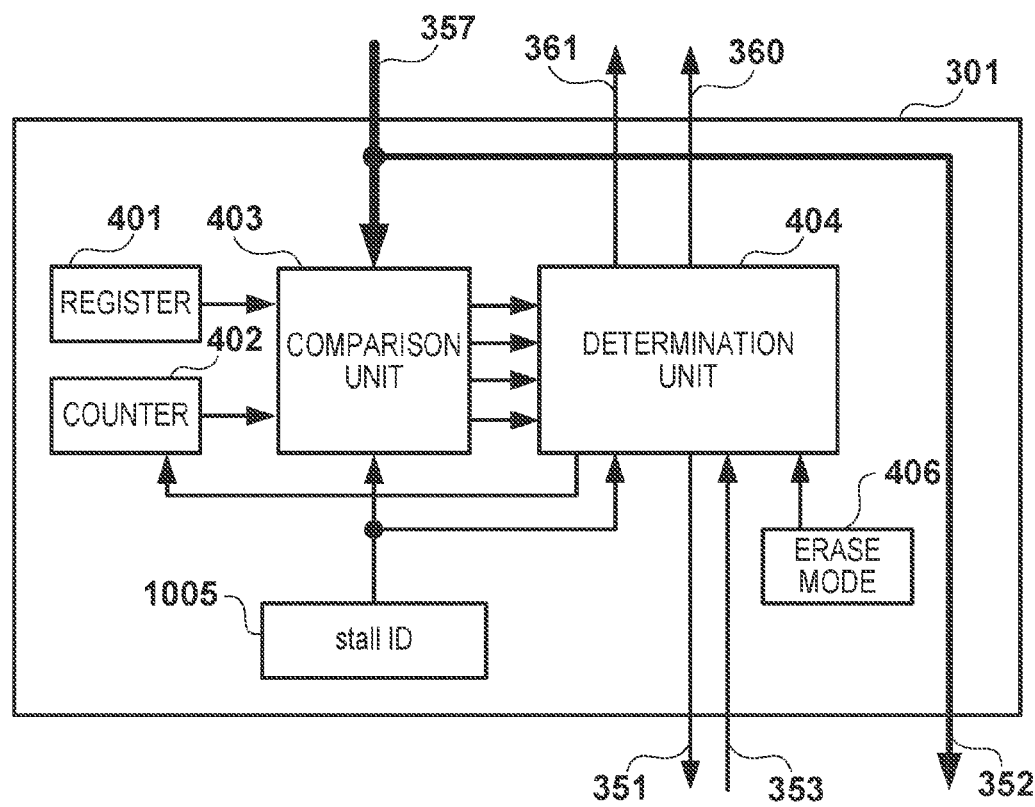
FIG. 10 shows a configuration of a reception unit pertaining to the second embodiment.

FIG. 10 shows the configuration of a reception unit 301 pertaining to the present embodiment. The reception unit 301 of the present embodiment differs from that of the first embodiment in the following points: the reception unit 301 includes the stall ID register 1005 in place of the stall counter 405; wiring of a comparison unit 403 and a determination unit 404; and operations of the comparison unit 403 and the determination unit 404. In the present embodiment, the reception unit 301 can invalidate the stall ID 802 in a packet stored in a buffer 302 only when the stall ID 802 in the received packet matches the branch number in the stall ID register 1005.

Although the comparison unit 403 in the reception unit 301 monitors whether or not the stall flag 202 is invalid in the first embodiment, it monitors whether or not the stall ID 802 is "0" in the present embodiment. Note that the operations executed when the stall ID 802 is "0" match the operations executed when the stall flag 202 is invalid in the first embodiment. On the other hand, when the stall ID 802 is not "0", if the stall ID 802 in the received packet matches the value stored in the stall ID register, the comparison unit 403 outputs a stall ID match signal in "valid" state to the determination unit 404. Note that the stall valid signal is valid when the stall ID is not "0".

The determination unit 404 outputs a control signal for the stall ID 802 to the buffer 302 via the signal line 361. As to the types of control, control for clearing and control for maintenance are similar to those of the first embodiment, but control for setting is to write the value stored in the stall ID register 1005 to the stall ID 802 in the packet. Furthermore, as the stall counter 405 is not provided in the present embodiment, control signals for incrementing/decrementing the count value are not output.

As to the operations of the determination unit 404, the operation (1-1) is similar as in the first embodiment. On the other hand, the operation (1-2) is executed when the stall ID match signal is valid. When the stall ID match signal is valid, it means that the reception unit 301 has received a packet that was suspended by itself. Therefore, data included in this packet is output to the corresponding processing unit 1203, and the stall ID 802 in the packet stored in the buffer 302 is cleared (invalidated). Whether to invalidate or maintain the valid flag is determined based on whether the erase mode is valid or invalid, as with the above-described operations (1-2-1) and (1-2-2). As with the first embodiment, the operation (2-1) is executed when the connection ID match signal and the count value match signal are valid, the stall valid signal is invalid, and the stall signal via the signal line 353 is valid. However, unlike the first embodiment, when the connection ID match signal is valid and the count value match signal and the stall valid signal are invalid, the operation (2-1) is executed if the stall ID match signal is valid. That is to say, the condition that the stall counter 405 is other than "0" in the first embodiment is replaced by the condition that the stall ID match signal is valid in the present embodiment. The value stored in the stall ID register 1005 is written to the stall ID 802 in the packet stored in the buffer 302. On the other hand, the operation (2-2) is similar as in the first embodiment.

The communication units 1202 are allowed to change the value of the stall ID 802 only when the stall ID 802 is 0 or when the stall ID 802 matches the branch number stored in the stall ID register 1005. More specifically, when the stall ID 802 is 0, the communication units 1202 are allowed to change the value of the stall ID 802 to the branch number stored in the stall ID register 1005. When the stall ID 802 matches the branch number stored in the stall ID register 1005, the communication units 1202 are allowed to change the value of the stall ID 802 to 0 by clearing it.

(Configuration of Transmission Unit)

In the present embodiment, a transmission unit 304 has the configuration shown in FIG. 7 as with the first embodiment. The operations of the transmission unit 304 are similar as in the first embodiment. However, when packetizing data output from the corresponding processing unit 1203, the transmission unit 304 sets the stall ID 802 to "0".

(Operations of Data Path Control Mechanism)

Figure 11A:
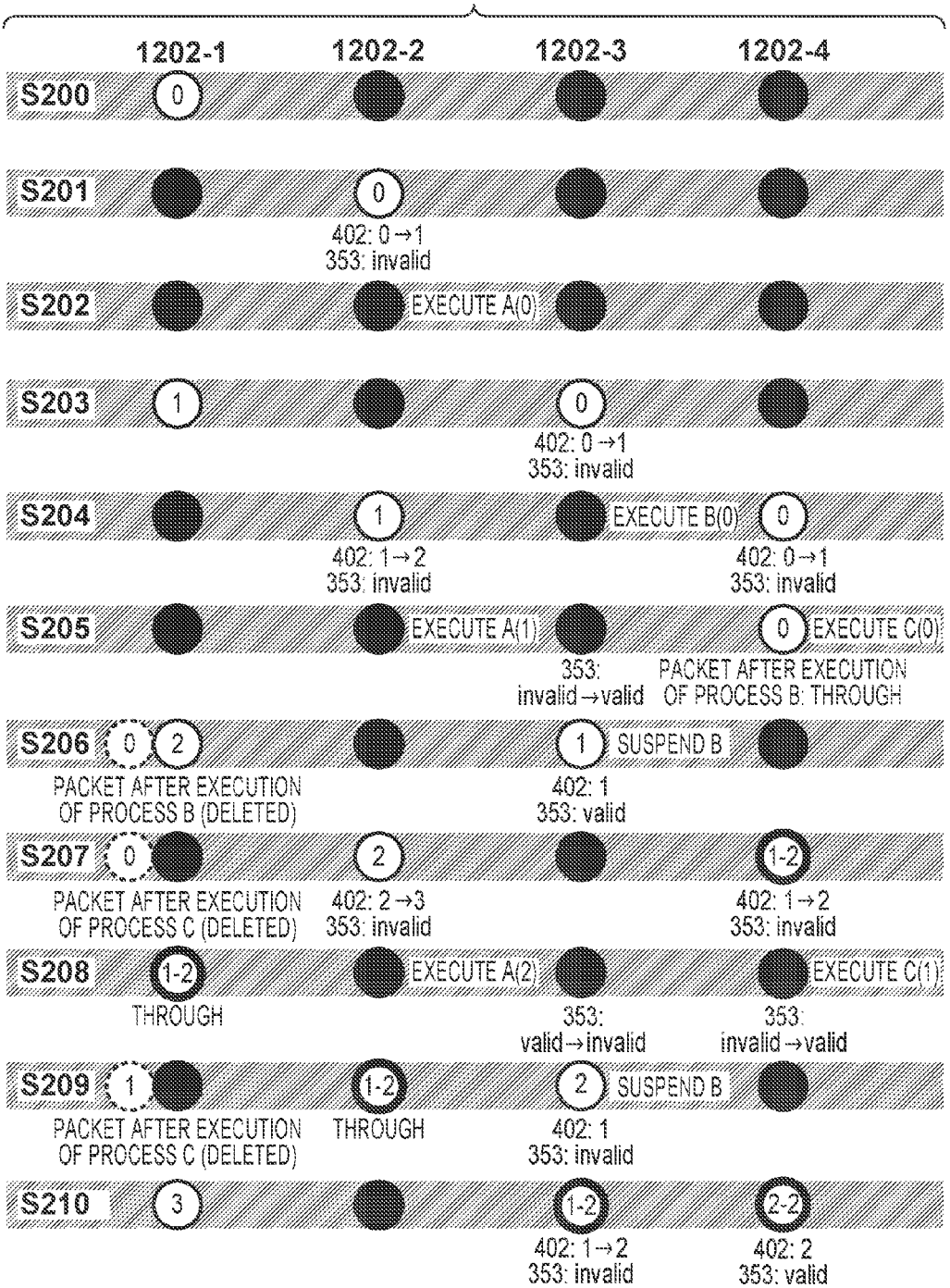
FIG. 11A shows operations of a data path control mechanism pertaining to the second embodiment.
Figure 11B:
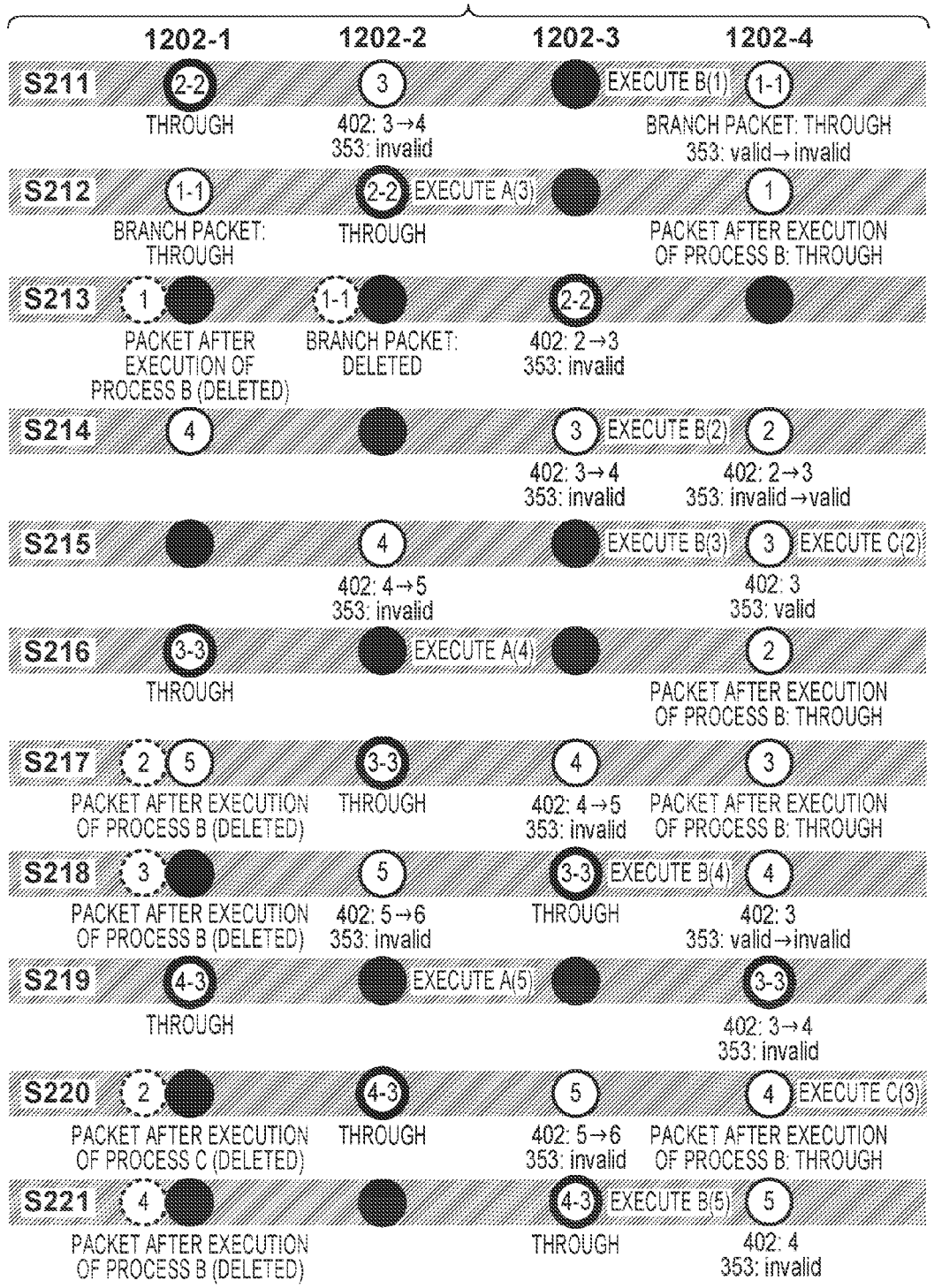
FIG. 11B shows operations of the data path control mechanism pertaining to the second embodiment.

A description is now given of operations of the branch process of the data path control mechanism pertaining to the second embodiment with reference to FIGS. 11A and 11B. As the branch process, processes A→B and A→C are executed in parallel. The following description is given under the assumption that the control unit 100 has set the values of the registers 401 and 501 in the communication units 1202-1 to 1202-4 to values for realizing the branch process. Furthermore, the erase mode register 406 is set to be invalid in the communication unit 1202-3, and the erase mode is set to be valid in the other communication units 1202. In addition, the branch numbers 1, 1, 2, and 3 are respectively set in the stall ID registers 1005 of the communication units 1202-1 to 1202-4.

In FIGS. 11A and 11B, circles with the numbers denote valid packets (in which the valid flag 201 is valid), the numbers in the circles denote the count values 203 of packets, and the circles with a bold outline denote packets in which the stall ID 802 is other than "0". The expression "X-Y" in the circles with a bold outline denotes packets which include the Xth data and in which the stall ID 802 is Y. Filled circles denote empty packets. The numbers 402 and 353 below the valid packets respectively indicate the value in the counter 402 and the state of the stall signal input via the signal line 353. In order to simplify the description, it is assumed here that the processing unit 1203-2 and the input/output unit 1201 can always process data, and the communication units 1202-2 and 1202-1 do not output a suspended packet.

The operations of S200 to S205 are similar to those of S0 to S5 in FIG. 8A. In S206, the processing unit 1203-3 judges that the stall signal is valid. At this time, the operation for incrementing the value in the stall counter 405 is not executed because there is no stall counter 405 in the present embodiment. However, the stall ID 802 in the packet output in S207 is set to "2", which is the value stored in the stall ID register 1005 of the communication unit 1202-3. Therefore, in FIG. 11A, the number "1-2" is shown in the packet with a bold outline that arrives at the communication unit 1202-4 in S207. In the subsequent processes, when suspension occurs, the value stored in the stall ID register 1005 in the communication unit 1202 is written to the stall ID 802 in the packet in a similar manner. As set forth above, as opposed to the first embodiment in which the value of the stall counter 405 is incremented, the stall ID 802 in the packet stored in the buffer 302 is set to the value stored in the stall ID register 1005 in the present embodiment. Similarly, in the present embodiment, when the stall ID 802 in the received packet matches the value stored in the stall ID register 1005, control is executed to process data included in this packet and clear the stall ID. At this time, the internal state of the communication units 1202 does not change unlike the case of the first embodiment in which the value of the stall counter 405 is decremented. As has been described above, although the operations of the second embodiment differ from those of the first embodiment in relation to the stall ID 802 and the stall counter 405, other operations of the second embodiment are substantially similar to those of the first embodiment. Therefore, a description of other steps is omitted.

As set forth above, a complicated branch process that involves outputting a suspended packet can be realized by allowing identification of modules and branches that have output the suspended packet. An increase in the number of modules and the number of branches on the ring bus can be easily accommodated by increasing the number of bits in the stall counter or the number of bits of the stall ID. In this way, the present embodiment makes it possible to accommodate a complicated branch process with the use of simple hardware.

The present invention can provide an information processing apparatus, a communication method and storage medium that can execute a branch process without losing data in a data path control mechanism where a plurality of processing units are connected by a ring-shaped bus.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable storage medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An information processing apparatus including a plurality of communication units connected to one another in a ring shape by a bus, each of the plurality of communication units being connected to one of a plurality of processing units, each of which executes a predetermined process, and transmitting data processed by the one of the plurality of processing units to the bus as a packet, the information processing apparatus transferring data between the processing units and processing the data in a predetermined order, wherein among the plurality of communication units, at least one communication unit comprises:

a holding unit configured to receive a packet including data and suspension information indicating whether or not a process for the data has been suspended, and to hold the received packet;

a transmission unit configured to transmit a packet held in the holding unit to the bus; and a determination unit configured to perform a determination of whether or not data included in a packet held in the holding unit is to be processed by one of the plurality of processing units to which the at least one communication unit connects, a determination of whether, in a case where suspension information included in a packet received by the holding unit indicates that a process for data included in the received packet has been suspended, setting for the suspension information is performed by the holding unit or not, and a determination of whether, in a case where data included in a packet received by the holding unit is to be processed by the one of the plurality of processing units to which the at least one communication unit connects, a process for the included data is to be suspended or not, wherein the holding unit does or does not execute, according to the determination by the determination unit, a process for a held packet that is held by the holding unit, and the transmission unit transmits, to the bus, a packet for which the process has been executed or the held packet that is held by the holding unit.

2. The information processing apparatus according to claim 1, wherein the holding unit performs, in a case where data included in a packet received by the holding unit is to be processed by the one of the processing units to which the at least one communication unit connects and the determination unit determines that a process for the included data is to be suspended, setting of the suspension information included in the packet received by the holding unit to a value indicating that a process for data included in the packet received by the holding unit has been suspended, and the transmission unit transmits, to the bus, a packet for which the setting is performed by the holding unit.

3. The information processing apparatus according to claim 1, wherein the holding unit does not execute a process for a packet received by the holding unit and the transmission unit transmits the packet received by the holding unit without modification to the bus in a case where suspension information included in the packet received by the holding unit indicates that a process for data included in the packet received by the holding unit has been suspended and the determination unit does not determine that setting for the suspension information is performed by the holding unit.

4. The information processing apparatus according to claim 1, wherein the holding unit does not execute a process for a packet received by the holding unit and outputs data included in the packet received by the holding unit to the one of the plurality of processing units to which the at least one communication unit connects, and the transmission unit transmits the packet received by the holding unit without modification in a case where the suspension information included in the packet received by the holding unit indicates that a process for the data included in the packet received by the holding unit has been suspended, where the determination unit does not determine that setting for the suspension information is performed by the holding unit, and where that data included in the packet received by the holding unit is to be processed by the one of the plurality of processing units to which the at least one communication unit connects.

5. The information processing apparatus according to claim 1, wherein the holding unit performs setting for invalidating a packet received by the holding unit, outputs data included in the packet received by the holding unit to the one of the plurality of processing units to which the at least one communication unit connects, and the transmission unit transmits, to the bus, a packet for which the setting is performed by the holding unit in a case where the suspension information included in the packet received by the holding unit indicates that a process for that data included in the packet received by the holding unit has been suspended and the determination unit determines that setting for the suspension information is performed by the holding unit.

6. The information processing apparatus according to claim 1, wherein the holding unit performs setting of suspension information included in a packet received by the holding unit to a value indicating that a process for data included in the packet received by the holding unit has not been suspended, outputs that data included in the packet received by the holding unit to the one of the plurality of processing units to which the at least one communication unit connects,
and the transmission unit transmits, to the bus, a packet for which the setting is performed by the holding unit in a case where the suspension information included in the packet received by the holding unit indicates that a process for that data included in the packet received by the holding unit has been suspended and the determination unit determines that setting for the suspension information is performed by the holding unit.

7. The information processing apparatus according to claim 1, further comprising a storage unit configured to store a number of packets, for each of which suspension information is set to a value indicating that a process for data included in each of the number of packets has been suspended,
wherein the determination unit performs the determination of whether or not, in a case where the suspension information included in a packet received by the holding unit indicates that a process for data included in the packet received by the holding unit has been suspended, setting for the suspension information is performed by the holding unit, based on the number.

8. The information processing apparatus according to claim 7, wherein the storage unit increments the number by one in a case where the holding unit performs setting of the suspension information included in a packet to a value indicating that a process for data included in the packet received by the holding unit has been suspended, and decrements the number by one in a case where the holding unit performs setting of the suspension information included in a packet to a value indicating that a process for data included in the packet received by the holding unit has not been suspended.

9. The information processing apparatus according to claim 7, wherein the storage unit sets the number to zero when starting input of data to the information processing apparatus.

10. The information processing apparatus according to claim 1, wherein the holding unit is allowed to, only in a case where suspension information included in a packet received by the holding unit indicates that a process for data included in the packet received by the holding unit has been suspended and the determination unit determines that the holding unit performs setting of the suspension information, or where the suspension information included in the packet received by the holding unit indicates that a process for data included in the packet received by the holding unit has not been suspended, change the suspension information.

11. The information processing apparatus according to claim 1, wherein the suspension information of a packet is capable of including, in a case where setting of the suspension information included in the packet to a value indicating that a process for data included in the packet has been suspended is performed, identification information for identifying a communication unit comprising a holding unit that performs that setting, the holding unit of the at least one communication unit includes identification information of the at least one communication unit into suspension information included in a packet held by the holding unit when performing setting of the suspension information included in the packet held by the holding unit to a value indicating that a process for data included in the packet held by the holding unit has been suspended.

12. The information processing apparatus according to claim 11, wherein the determination unit determines that suspension information included in a packet received by the holding unit is set by the holding unit in a case where identification information included in the suspension information matches identification information for identifying the at least one communication unit.

13. The information processing apparatus according to claim 11, wherein the holding unit is allowed to delete suspension information included in a packet received by the holding unit only in a case where identification information included in the suspension information matches identification information for identifying the at least one communication unit or where that identification information included in the suspension information is a specific value.

14. A communication method in an information processing apparatus including a plurality of communication units connected to one another in a ring shape by a bus, each of the plurality of communication units being connected to one of a plurality of processing units, each of which executes a predetermined process, and transmitting data processed by the one of the plurality of processing units to the bus as a packet, the information processing apparatus transferring data between the plurality of processing units and processing the data in a predetermined order, the method comprising:
in among the plurality of communication units, at least one communication unit that comprises a holding unit configured to receive a packet including data and suspension information indicating whether or not a process for the data has been suspended, and hold the received packet and a transmission unit configured to transmit a packet held in the holding unit to the bus,
performing a determination of whether or not data included in a packet held in the holding unit is to be processed by one of the plurality of processing units to which the at least one communication unit connects, a determination of whether, in a case where suspension information included in a packet received by the holding unit indicates that a process for data included in the packet received by the holding unit has been suspended, setting for the suspension information is performed by the holding unit or not, and a determination of whether, in a case where data included in a packet received by the holding unit is to be processed by the one of the plurality of processing units to which the at least one communication unit connects, a process for the data included in the packet received by the holding unit is to be suspended or not;
executing or not executing at the holding unit, according to the determination, a process for a held packet that is held by the holding unit; and
transmitting at the transmission unit, to the bus, a packet for which the process has been executed or the held packet that is held by the holding unit.

15. A non-transitory computer-readable storage medium storing a computer program for causing a computer to execute a communication method in an information processing apparatus including a plurality of communication units connected to one another in a ring shape by a bus, each of the plurality of communication units being connected to one of a plurality of processing units, each of which executes a predetermined process, and transmitting data processed by the one of the plurality of processing units to the bus as a packet, the information processing apparatus transferring data between the plurality of processing units and processing the data in a predetermined order, the method comprising:
  in among the plurality of communication units, at least one communication unit that comprises a holding unit configured to receive a packet including data and suspension information indicating whether or not a process for the data has been suspended, and hold the received packet and a transmission unit configured to transmit a packet held in the holding unit to the bus,
  performing a determination of whether or not data included in a packet held in the holding unit is to be processed by one of the plurality of processing units to which the at least one communication unit connects, a determination of whether, in a case where suspension information included in a packet received by the holding unit indicates that a process for data included in the packet received by the holding unit has been suspended, setting for the suspension information is performed by the holding unit or not, and a determination of whether, in a case where data included in a packet received by the holding unit is to be processed by the one of the plurality of processing units to which the at least one communication unit connects, a process for the data included in the packet received by the holding unit is to be suspended or not;
executing or not executing at the holding unit, according to the determination, a process for a held packet that is held by the holding unit; and
transmitting at the transmission unit, to the bus, a packet for which the process has been executed or the held packet that is held by the holding unit.

* * * * *